United States Patent
Palmeri et al.

(10) Patent No.: US 7,790,985 B2
(45) Date of Patent: *Sep. 7, 2010

(54) DEVICE FOR REPAIR OF A CONTACT PAD OF A PRINTED CIRCUIT BOARD

(75) Inventors: Joseph P. Palmeri, Hopewell Junction, NY (US); Vincent P. Mulligan, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/136,308

(22) Filed: Jun. 10, 2008

(65) Prior Publication Data

US 2008/0251289 A1 Oct. 16, 2008

Related U.S. Application Data

(63) Continuation of application No. 11/623,484, filed on Jan. 16, 2007, now Pat. No. 7,399,930.

(51) Int. Cl.
*H05K 1/00* (2006.01)

(52) U.S. Cl. .................. 174/250; 174/262; 174/265

(58) Field of Classification Search .............. 174/250, 174/262, 265
See application file for complete search history.

(56) References Cited

U.S. PATENT DOCUMENTS

| | | | |
|---|---|---|---|
| 4,803,595 A | 2/1989 | Kraus et al. | |
| 5,290,970 A * | 3/1994 | Currie | 174/250 |
| 6,443,739 B1 | 9/2002 | Currie | |
| 6,651,322 B1 * | 11/2003 | Currie | 29/840 |
| 6,784,377 B2 * | 8/2004 | Chamberlin et al. | 174/265 |
| 6,954,984 B2 | 10/2005 | McAllister et al. | |
| 7,008,271 B2 | 3/2006 | Jorgensen | |
| 7,199,309 B2 * | 4/2007 | Chamberlin et al. | 174/265 |
| 7,297,572 B2 * | 11/2007 | Salmon | 438/106 |
| 7,399,930 B1 * | 7/2008 | Palmeri et al. | 174/267 |
| 2002/0166696 A1 * | 11/2002 | Chamberlin et al. | 174/262 |
| 2002/0179324 A1 * | 12/2002 | Chamberlin et al. | 174/255 |
| 2004/0159915 A1 | 8/2004 | McAllister et al. | |
| 2006/0021795 A1 * | 2/2006 | Howard et al. | 174/267 |

* cited by examiner

*Primary Examiner*—Hung S Bui
*Assistant Examiner*—Andargie M Aychillhum
(74) *Attorney, Agent, or Firm*—Stephen Bongini; Fleit Gibbons Gutman Bongini & Bianco PL

(57) ABSTRACT

Methods and devices are provided for repairing a damaged contact pad that is located on a first surface of a printed circuit board and connected to a via that passes through the circuit board. According to the method, a countersink hole is created in the first surface of the printed circuit board in a location that is substantially centered on an axis passing through the via, and a replacement structure is inserted into the countersink hole. The replacement structure has a stem portion, a head portion, and a shoulder portion that connects the stem and head portions, with the angle of the shoulder portion substantially matching the angle of the shoulder of the countersink hole. The stem portion of the replacement structure is permanently attached to sidewalls of the via so as to electrically couple the head portion of the replacement structure to the via.

12 Claims, 5 Drawing Sheets

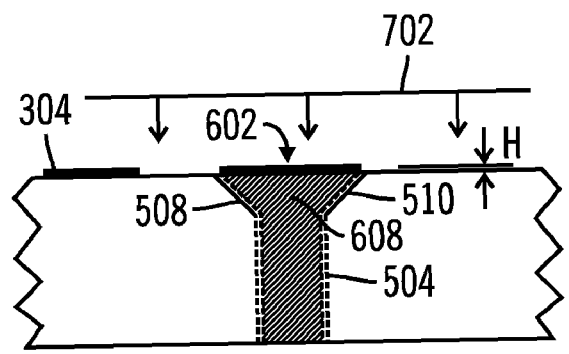
FIG. 5
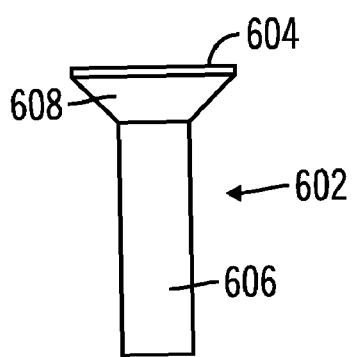
FIG. 6A
FIG. 6B
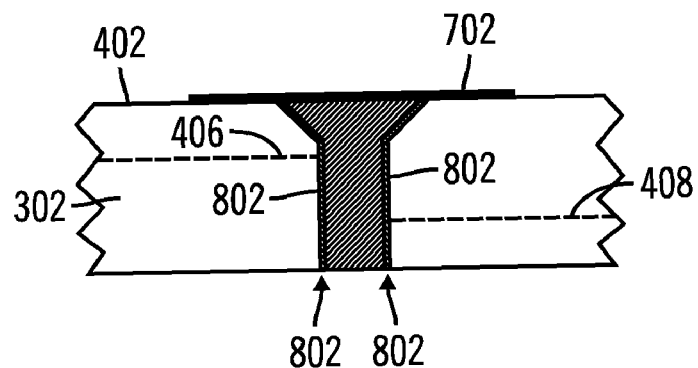
FIG. 7
FIG. 8

DEVICE FOR REPAIR OF A CONTACT PAD OF A PRINTED CIRCUIT BOARD

CROSS-REFERENCE TO RELATED APPLICATIONS

This is a continuation of application Ser. No. 11/623,484, filed Jan. 16, 2007, now U.S. Pat. No. 7,399,930. The entire disclosure of prior application Ser. No. 11/623,484 is herein incorporated by reference.

FIELD OF THE INVENTION

The present invention relates to repairing printed circuit boards, and more particularly relates to a method and device for repairing individual contact pads of a printed circuit board.

BACKGROUND OF THE INVENTION

Printed-wiring technology is currently used to fabricate circuit boards having embedded circuit traces. These traces are interconnected by "vias," or plated thru-holes, that connect one trace on one circuit board layer to another trace on a different layer. In electronic systems, there are a variety of electrical connection types between the circuit board and the components such as integrated circuits that are attached to the circuit board. As integrated circuits become more dense, so too must the electrical connections.

A land grid array (LGA) is an electrical connection interface for components, such as microprocessors. Unlike the pin grid array (PGA) interface commonly found on integrated circuits, with LGA, there are no pins on the chip; in place of the pins are pads of bare gold-plated copper that touch pins on the circuit board. Such LGAs offer high interconnection density (e.g., at a one millimeter pitch, a 35×35 grid may contain 1,225 interconnections in a space less than 1.5 square inches and 2,025 interconnections in a 45×45 grid less than 1.75 square inches). LGAs are easy to manufacture and the cost of module production is much less because terminations such as pins or balls are no longer required.

Many modern circuit boards for use with LGAs or other electrical connection interfaces have a very large number of connections and vias extending from the external connections on one surface of the circuit board to internal wiring, and to wiring and connections on the opposite surface of the circuit board. In many instances, if a few or even one of these connections is defective, the entire board is defective and the connection and associated via must either be repaired or replaced, or the entire board has to be scrapped.

One known solution for working with damaged LGA pads is to remove the damaged pad and utilize a lily pad-shaped repair pad that is etched on a printed circuit board, as shown in FIG. 1. The pad 102 has a tail section 104 that is able to be inserted through a via of a multi-layer circuit board and soldered on the opposite side of the circuit board. Conventional lily pad-shaped repair pads are manufactured by etching the pad 102 onto a copper-plated board 124, and then cutting along lines 106-122 to remove the pad. Once the pad 102 is removed from the circuit board 124, the tail 104 is folded down so that it can be inserted into the appropriate via. Unfortunately, as shown in FIG. 2, this leaves a void 202 in the portion of the pad 102 that is to be used to make contact with a component. This results in a repaired site with a pad that does not have a round and smooth contact pad surface. This presents a problem, particularly with components that have spring movement contact arms.

Spring movement LGA socket devices, such as the Tyco "cantilevered-spring," typically reduce co-planarity problems by effectively taking up slack when there is a problem with co-planarity on the bottom of the device. However, spring contacts move as the component is pressed against the LGA pads.

Because of the irregular surface of the lily pad-shaped pad, attachment mechanisms such as a cantilevered-type spring connector cannot be used, as the tip of the connector may bind on the gap 202 on the repaired pad 102 during the mating/compression process, causing further damage to the repaired pad or damage to the interconnect device.

Another known solution is to use a replacement pad and a wire that runs through the circuit board. More specifically, in this repair process the damaged pad is removed from one side of the circuit board. The wire is inserted into the via and ran through so as to protrude on the opposite side of the circuit board. The replacement pad is attached to the area from which the damaged pad was removed using an adhesive, and the wire is soldered to the replacement pad. The wire protruding on the opposite side of the circuit board is soldered to the via and the excess wire is clipped so as to make it flush with the circuit board. While the damaged pad is replaced, this repair process requires the creation of a second solder connection on the underside of the repair pad, which creates another point of failure.

SUMMARY OF THE INVENTION

One embodiment of the present invention provides a method for repairing a damaged contact pad that is located on a first surface of a printed circuit board and connected to a via that passes through the circuit board. According to the method, a countersink hole is created in the first surface of the printed circuit board in a location that is substantially centered on an axis passing through the via, and a replacement structure is inserted into the countersink hole. The replacement structure has a stem portion, a head portion, and a shoulder portion that connects the stem and head portions, with the angle of the shoulder portion substantially matching the angle of the shoulder of the countersink hole. The stem portion of the replacement structure is permanently attached to sidewalls of the via so as to electrically couple the head portion of the replacement structure to the via.

Another embodiment of the present invention provides replacement structure for repairing a damaged contact pad on a printed circuit board. The replacement structure includes a head portion, a sloping shoulder portion connected to the head portion, and a stem portion connected to the shoulder portion so that the replacement structure has a generally T-shaped configuration. The head portion has a substantially planar upper surface for electrically and physically contacting an electrical component, and the shoulder portion has an angle that substantially matches the angle of a countersink hole in the circuit board. The stem portion is able to be inserted into a via that is in the circuit board below the damaged contact pad.

A further embodiment of the present invention provides a printed circuit board having a repaired contact pad. The printed circuit board includes a via that passes through the circuit board, a countersink hole in a first surface of the printed circuit board in a location that is substantially centered on an axis passing through the via, and a replacement structure that is inserted into the countersink hole. The replacement structure has a stem portion, a head portion, and a shoulder portion that connects the stem portion to the head portion, with the angle of the shoulder portion substantially matching the angle of a shoulder of the countersink hole. The stem portion of the replacement structure is permanently attached to sidewalls of the via so as to electrically couple the head portion of the replacement structure to the via.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 5 is a side view of the LGA circuit board of FIG. 3 with a countersink hole drilled into an upper surface of the circuit board according to an embodiment of the present invention.

FIG. 6a is a top view of a replacement conductor/contact pin according to this embodiment of the present invention.

FIG. 6b is a side view of the replacement conductor/contact pin of FIG. 6a.

FIG. 7 is a side view showing the replacement conductor/contact pin of FIG. 6a inserted into the countersink hole of FIG. 5.

FIG. 8 is a side view showing the inserted replacement conductor/contact pin of FIG. 7 attached to the via according to this embodiment of the present invention.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The present invention, according to preferred embodiments, provides a device and method for repairing or replacing an electrical interface on a printed circuit board, such that the repaired device presents a solid durable surface that is able to accept spring loaded LGA socketed components without danger of pad or component socket damage.

Figure 1:
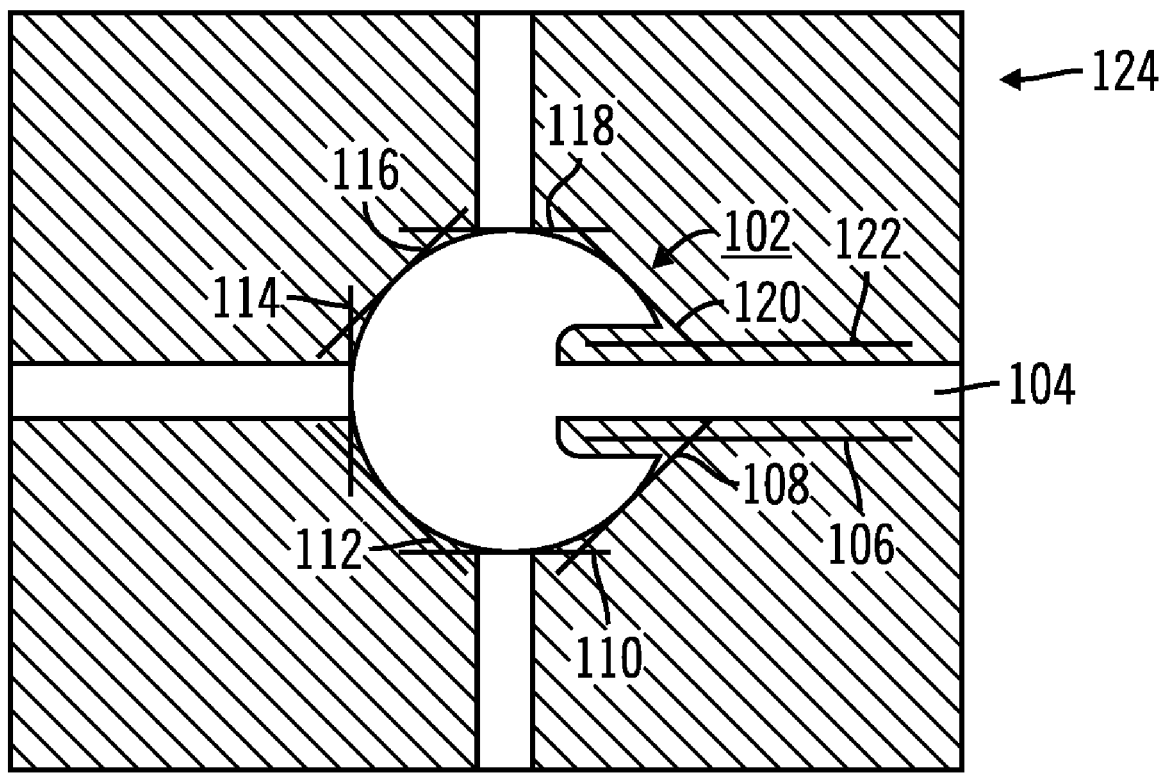
FIG. 1 is a plan view of a conventional lily pad-shaped repair pad etched on a printed circuit board.
Figure 2:
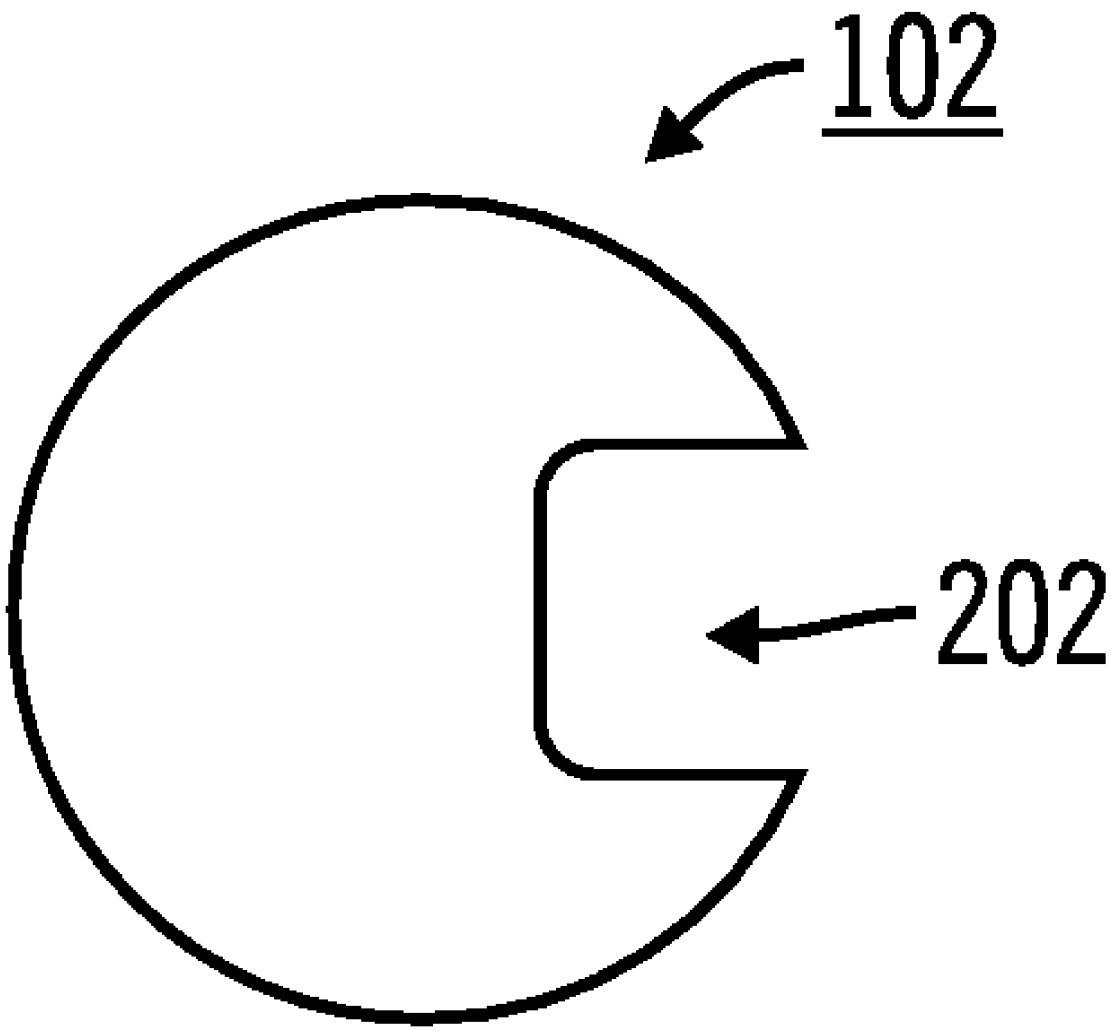
FIG. 2 is a plan view of the lily pad-shaped repair pad of FIG. 1 after removal from the printed circuit board and with its tail section bent downward.
Figure 3:
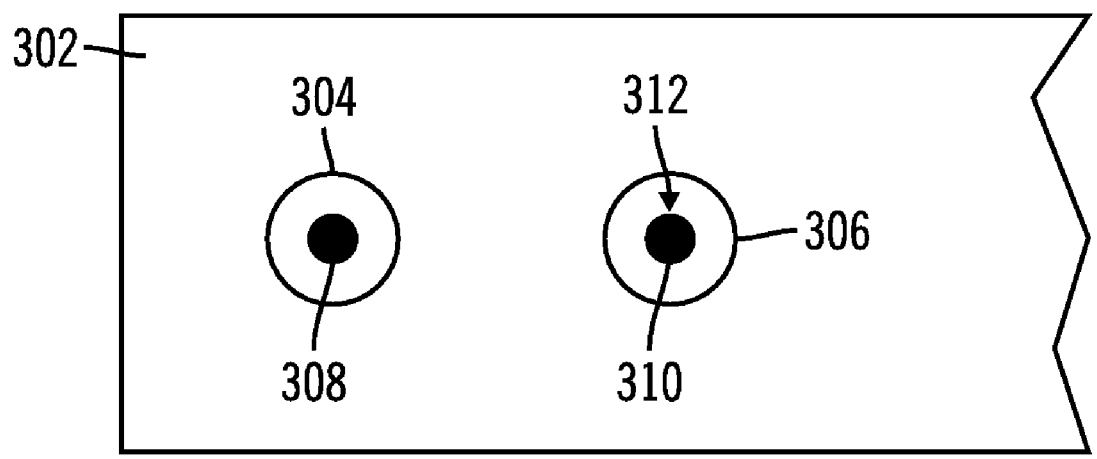
FIG. 3 is a plan view of a portion of an exemplary LGA circuit board with two circular contact pads.
Figure 4:
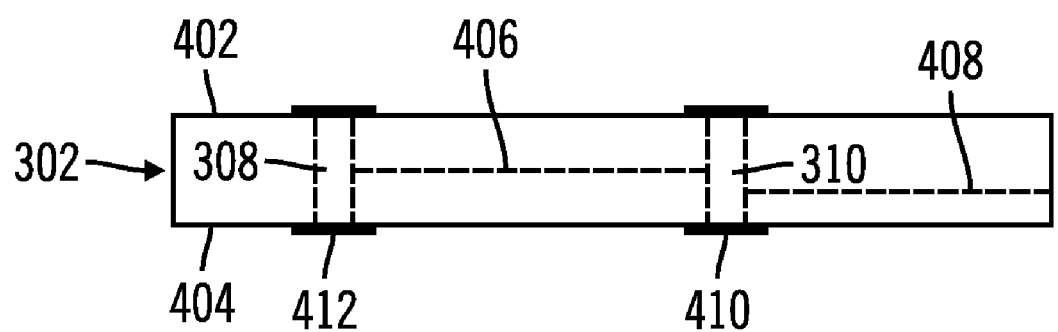
FIG. 4 is a side view of the LGA circuit board of FIG. 3 illustrating vias and conductive layers.

FIG. 3 shows a plan view of a portion of an exemplary LGA circuit board 302 with two circular contact pads 304 and 306. Each of the contact pads 304 and 306 is electrically coupled to a via 308 and 310, respectively. In the context of a printed circuit board, a "via" is a plated hole that connects one or more conductive (e.g., copper) pathways on one layer of the circuit board to features such as conductive pathways on one or more other layers. As shown in FIG. 4, each of the vias 308 and 310 penetrates the upper surface 402 of the circuit board 302 and travels down to reach the bottom surface 404.

Each of the vias 308 and 310 of FIG. 4 begins as a hole that is drilled or formed in the circuit board material, and then the hole is lined with a conductive metallic material to form a conductive sleeve that is attached to the walls of the via. The vias provide electrical communication between conductors, such as conductors 406 and 408, that are provided on layers within the circuit board, as well as with contact pads 412 and 410 that are located on the bottom side 404 of the circuit board 302.

Occasionally a contact pad is damaged. For example, via 310 of the exemplary circuit board shown in FIG. 3 has an area 312 in which the material of the pad 410 has broken off of the circuit board. Many other types of damage to contact pads are also known to occur. When a pad is damaged, the entire board or electronic system can become non-functional. Therefore, it is important to be able to effectively repair the damaged pad so that the circuit board functions properly and does not have to be discarded.

Figure 9:
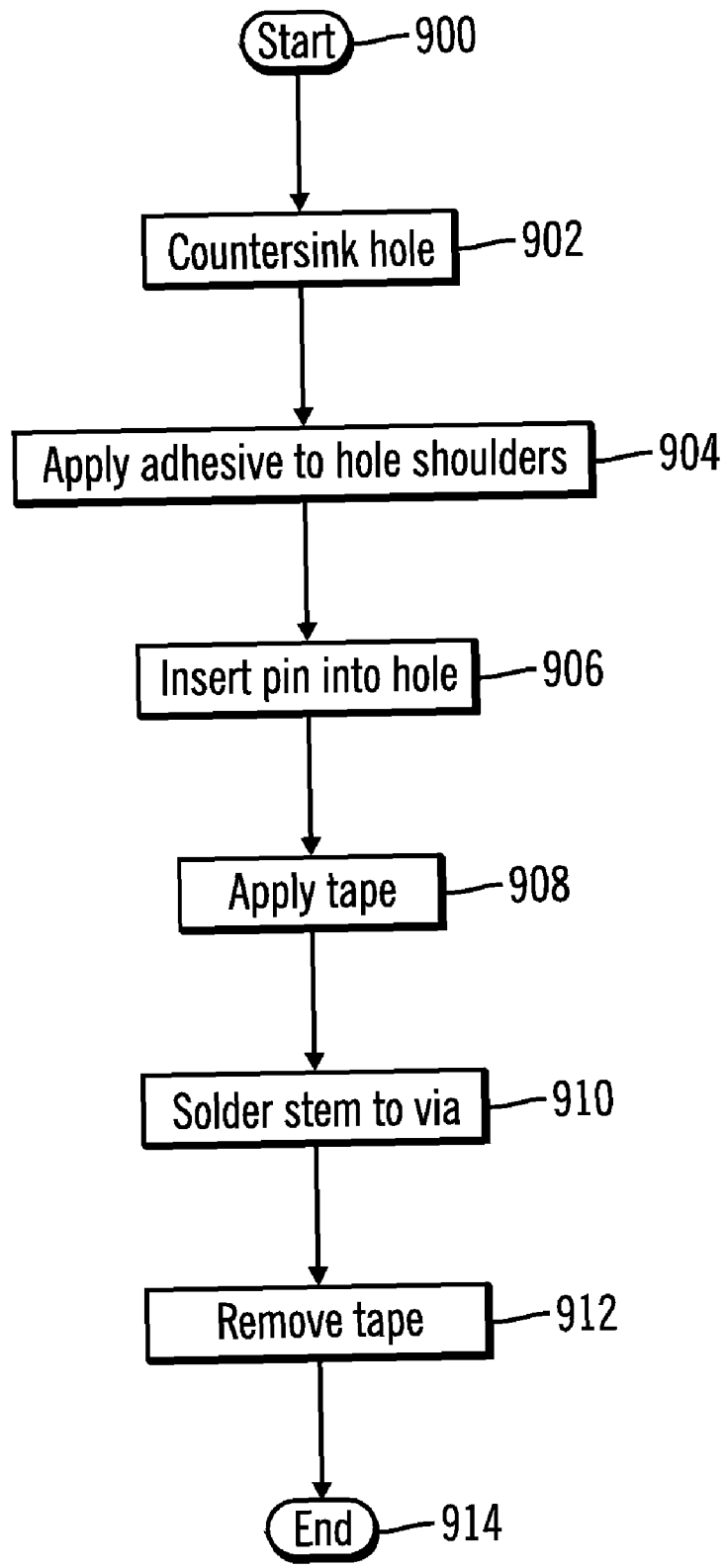
FIG. 9 is an operational flow diagram illustrating a contact pad repair process according to one embodiment of the present invention.

FIGS. 5-8, in conjunction with the flow diagram of FIG. 9, show a process for repairing/replacing a damaged contact pad according to one embodiment of the present invention. The LGA pad repair process begins at step 900 of FIG. 9 and moves directly to step 902, in which a drill device 502, shown in FIG. 5, is used to make a countersink hole 506 in the upper surface 402 of the circuit board 302 in a location that is substantially centered on an axis 514 passing through the via 504. To properly create the countersink hole, the bit 502 used to drill is much larger than the via 504, and preferably larger than the damaged contact pad. In this embodiment of the present invention, the drilling device 502 is placed directly on top of the damaged contact pad 306. The spinning drill completely removes the damaged contact pad from the circuit board 302 as it sinks part way through the circuit board material to make the counterbore 506 (i.e., countersink hole).

The result is, as shown in the side views of the figures, a set of shoulders 508 and 510, which from a top view is seen to be one continuous shoulder going around the via, above the previously-existing opening in the center of the via that passes through the remainder of the circuit board. The shoulder 508 and 510 of the countersink hole provides a seat for a shoulder portion of a repair pin that is used in this embodiment of the present invention.

FIG. 6a is top view of a replacement conductor/contact pad structure 602 in accordance with one embodiment of the present invention. As shown, the replacement structure 602 has a substantially uniformly round-shaped head 604 that will provide an area for electrical contact with a component placed on the circuit board 302.

FIG. 6b shows a side view of the replacement structure 602 (or "pin") of FIG. 6a. The pin 602 has a generally T-shaped configuration and includes a stem portion 606 connected to the head portion 604 by a shoulder portion 608. In this embodiment, the pin 602 is one continuous piece of material formed from a conductive substance, such as a metal. In preferred embodiments of the present invention, the head portion 604 of the pin has a diameter 610 that is substantially equal to the greatest diameter 512 of the countersink hole 506, and the shoulder portion 608 of the pin has an angle that substantially matches and mates with the angle of the shoulder 508 and 510 of the countersink hole 506.

In this embodiment of the present invention, next in step 904 an adhesive 512 is applied to the shoulder 508 and 510 of the counterbored hole 506. The adhesive 512 can be epoxy or any other adhesive. In step 906, the pin 602 is inserted into the via 504, as shown in FIG. 7. The shoulder portion 608 of the pin 602 mates with the shoulder 508 and 510 of the counterbored hole 506 (i.e., countersink) so as to be seated securely in the hole. The adhesive 512 assists in permanently securing the pin 602 in place.

In this embodiment, after the inserting step 906, the head portion 604 extends from the top of the circuit board 302 by a height H that is equal to the height of an adjacent contact pad 304. In this raised position, the pin 602 provides a well-defined contact surface that is substantially planar with the other contact pads to allow easy attachment of a component such as an integrated circuit that is to be attached to the circuit board 302.

In a further step 908, a piece of tape 702 is applied to the upper surface of the head portion 604 of the pin 602 in an overlapping manner so as to also cover a portion of the upper surface 402 of the circuit board 302, as shown in FIGS. 7 and 8. The tape 702 acts to further temporarily secure the pin 602 into position and to protect the surface of the pin 602. In this embodiment, the tape is a high-temperature tape because the pin 602 is subsequently heated to a high temperature.

A soldering process is then performed in step 910 in which the stem portion 606 of the pin 602 is heated by accessing the stem 606 from the bottom side 404 of the circuit board 302. The heating can be accomplished by any method, such as by using a soldering iron. After sufficient heating of the pin 602, solder 802 is provided to the heated area on the bottom side of the circuit board. Through a natural phenomena known as "sweating," some of the solder is sucked into the small gap between the pin 602 and the via walls 504. The solder 802 provides a solid conductive joint between the pin 602 and the conductive metallic material lining the walls of the via 505. Thus, there is formed a direct conductive pathway from the head portion 604 of the pin 602, to which a component will be attached, to conductors 406 and 408 provided on layers within the circuit board 302. The pin 602 also provides a direct electrical connection through the circuit board 302. In this embodiment, the pin 602 is of a length so that, when seated on the shoulder 508 and 510 of the counterbored hole 506, the pin extends just to the bottom surface 404 of the circuit board 302. This length provides the added advantage that there is no need to trim the stem portion 606 after the pin 602 is soldered into position, as shown in FIG. 8.

In step 912, the tape 702 is removed after the pin 602 has been securely soldered into place. Thus, the original damaged contact pad 306 is now replaced by the replacement conductor/contact pad structure 602 and the process ends at step 914.

Accordingly, embodiments of the present invention provide advantages over conventional methods of contact pad repair. The replacement conductor/contact pad structure 602 (or "pin") used in embodiments of the present invention is easily inserted into and connected to the circuit board so as to provide a replacement pad surface that has substantially the same size and shape as the original pad and requires only one solder connection. Also, the surface of the replacement structure is flat, smooth, and void of any gaps, so it is compatible with both wire ball interconnect devices and spring interconnect devices.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A replacement structure for repairing a damaged contact pad on a printed circuit board, the structure comprising:
   a head portion with a substantially planar upper surface for electrically and physically contacting an electrical component;
   a sloping shoulder portion having an angle for substantially matching an angle of a countersink hole in the circuit board, the shoulder portion being connected to the head portion; and
   a stem portion for insertion into a remaining portion of a via that is in the circuit board below the damaged contact pad, the stem portion being connected to the shoulder portion so that the replacement structure has a generally T-shaped configuration,
   wherein the sloping shoulder portion slopes at a constant angle from a lower surface of the head portion to an upper surface of the stem portion, and
   the head portion, shoulder portion, and stem portion combine such that the replacement structure has a length that is substantially equal to the distance from an upper surface of the damaged contact pad through the via to a bottom surface of the circuit board so as not to protrude from the bottom surface of the circuit board.

2. The replacement structure according to claim 1, wherein the upper surface of the head portion is substantially round.

3. The replacement structure according to claim 1, wherein the head portion is substantially round with a diameter that is substantially equal to a greatest diameter of the countersink hole.

4. A printed circuit board having a repaired contact pad, the printed circuit board comprising:
   a via that passes through the printed circuit board, the via comprising a hole with sidewalls and a conductive material that is attached to the sidewalls;
   a countersink hole in a first surface of the printed circuit board in a location that is substantially centered on an axis passing through the via, the countersink hole passing only part way through the printed circuit board so as to be located above a remaining portion of the via that passes through a remainder of the printed circuit board; and
   a replacement structure inserted into the countersink hole and the remaining portion of the via, the replacement structure including a stem portion, a head portion, and a shoulder portion that connects the stem portion to the head portion, the shoulder portion having an angle that substantially matches an angle of a shoulder of the countersink hole,
   wherein the stem portion of the replacement structure is permanently attached to the conductive material attached to the sidewalls of the remaining portion of the via so as to electrically couple the stem portion of the replacement structure to the conductive material attached to the sidewalls of the remaining portion of the via, and
   a bottom surface of the replacement structure is substantially planar with a bottom surface of the circuit board so as not to protrude from the bottom surface of the circuit board.

5. The printed circuit board according to claim 4, wherein the damaged contact pad is completely removed.

6. The printed circuit board according to claim 4, wherein the shoulder portion of the replacement structure is attached to the shoulder of the countersink hole by an adhesive.

7. The printed circuit board according to claim 4, wherein the stem portion of the replacement structure is permanently attached to the conductive material attached to the sidewalls of the remaining portion of the via by solder such that the solder provides a solid conductive joint between the replacement structure and the conductive material attached to the sidewalls of the remaining portion of the via.

8. The printed circuit board according to claim 4, wherein a top surface of the replacement structure is substantially planar with a top surface of an adjacent contact pad on the circuit board.

9. The printed circuit board according to claim 4, wherein the head portion of the replacement structure is substantially round with a diameter that is substantially equal to a greatest diameter of the countersink hole.

10. A replacement structure for repairing a damaged contact pad on a printed circuit board, the structure comprising:

a head portion with a substantially planar upper surface for electrically and physically contacting an electrical component;

a sloping shoulder portion having an angle for substantially matching an angle of a countersink hole in the circuit board, the shoulder portion being connected to the head portion; and a stem portion for insertion into a remaining portion of a via that is in the circuit board below the damaged contact pad, the stem portion being connected to the shoulder portion so that the replacement structure has a generally T-shaped configuration, wherein the sloping shoulder portion slopes at a constant angle from a lower surface of the head portion to an upper surface of the stem portion, and the replacement structure has a length such that, when the replacement structure is inserted into the countersink hole and the remaining portion of the via, a bottom surface of the replacement structure is substantially planar with a bottom surface of the circuit board so as not to protrude from the bottom surface of the circuit board.

11. The replacement structure according to claim 10, wherein the upper surface of the head portion is substantially round.

12. The replacement structure according to claim 10, wherein the head portion is substantially round with a diameter that is substantially equal to a greatest diameter of the countersink hole.

* * * * *